(12) United States Patent
Belenli et al.

(10) Patent No.: US 6,387,525 B1
(45) Date of Patent: May 14, 2002

(54) SELF INSULATING SUBSTRATE TAPE

(75) Inventors: Ibrahim Belenli; Yusuf Hascicek; Ibrahim Mutlu, all of Telahassee, FL (US)

(73) Assignee: Florida State University, Tallahassee, FL (US)

(*) Notice: Subject to any disclaimer, the term of this patent is extended or adjusted under 35 U.S.C. 154(b) by 0 days.

(21) Appl. No.: 09/560,787

(22) Filed: Apr. 28, 2000

Related U.S. Application Data

(63) Continuation-in-part of application No. 08/839,429, filed on Apr. 14, 1997, now abandoned.

(51) Int. Cl.[7] .............................. B32B 15/04; H01F 6/00
(52) U.S. Cl. ........................ 428/469; 505/230; 505/231; 505/236
(58) Field of Search .................................. 428/632, 469, 428/472, 699, 701; 505/230, 231, 236, 237, 239

(56) References Cited

U.S. PATENT DOCUMENTS 4,872,086 A * 10/1989 Huang et al. ............... 361/321
5,434,129 A * 7/1995 Motowidlo et al. ......... 505/433
5,661,112 A * 8/1997 Hatta et al. ................. 505/237

OTHER PUBLICATIONS

Nikulin et al. Ultrathin ceramic insulation for Ag–sheathed high Tc Superconductors. IEEE Trans. Appl. Super. vol. 5 No. 2, Jun. 1995. pp. 1842–1844.*

* cited by examiner

Primary Examiner—Deborah Jones
Assistant Examiner—Gwendolyn Blackwell-Rudasil
(74) Attorney, Agent, or Firm—A. Jose Cortina; Kilpatrick Stockton LLP

(57) ABSTRACT

A process for manufacturing superconducting magnets is described. Two conducting tapes are assembled with an insulating ceramic layer deposited between facing sides of the tapes. The tapes and the insulative refractory material are bonded together by, for example, rolling to result in a self insulating substrate tape to which superconducting composition precursors are applied for later annealing. In one aspect, the composite tape is then wound to result in a pancake coil which is exposed to high temperatures in an oxidizing environment to convert the superconducting precursors to superconducting materials. The resultant high temperature superconducting composition coil can then be used as a high temperature superconducting magnet with appropriate conducting connectors applied thereto.

12 Claims, 4 Drawing Sheets

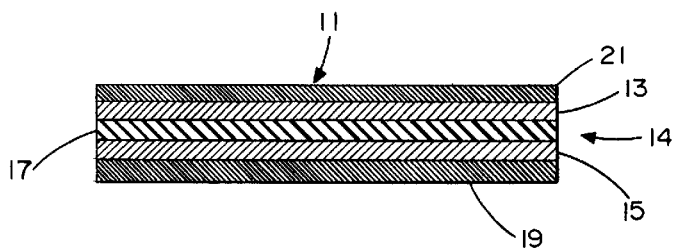
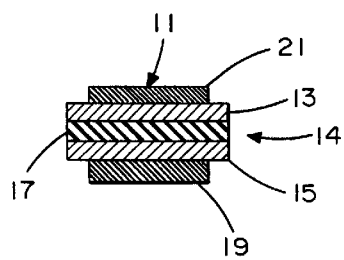
FIG. 1A　　　　　　　　FIG. 1B
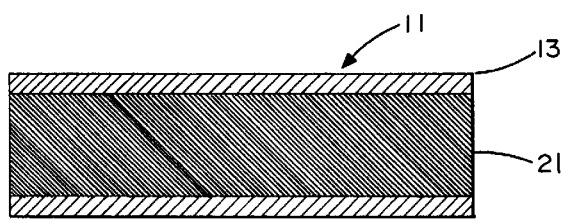
FIG. 1C

SELF INSULATING SUBSTRATE TAPE

CROSS REFERENCE TO RELATED APPLICATIONS

This application is a continuation in part of abandoned application Ser. No. 08/839,429 filed Apr. 14, 1997 of the same inventors herein, the disclosure of which is incorporated by reference herein, and to which priority is claimed.

FIELD OF THE INVENTION

This invention relates generally to self insulating substrate tapes, superconducting composite tapes and methods of manufacturing the tapes. In particular, the invention relates to the manufacture and use of self insulating substrate tapes to eliminate the problem of insulation for the construction of high temperature superconductor magnets, and to enable application of "wind and react" processes with insulation away from the high temperature superconductor phase.

BACKGROUND OF THE INVENTION

In the manufacture of high temperature superconductor magnets, it is often desirable to use composite tapes employing high temperature compatible insulating materials. Specifically, pancake coils are wound from high temperature superconductors in which a "wind and react" approach is used due to the brittle nature of the materials. As a result, it becomes necessary to use high temperature compatible electrically insulating materials for turn-to-turn insulation in any magnet built from the high temperature superconductors. In the past, ceramic based papers or tapes have been used for this purpose. However, a disadvantage with this type of approach is that such insulation, of course, takes up valuable winding space, and currently available materials have a thickness of about 0.1 mm or greater. In addition, insulating materials are in direct contact with the superconducting materials when magnets are made from dip coated high temperature superconducting (HTS) tapes. Almost all of the insulating materials react with the HTS materials (especially BSCO) during the final partial melt heat treatment process.

The wind and react method of the prior art involves winding the precursor to a superconducting material around a mandrel in order to form a coil, and then processing the coil with high temperatures in an oxidizing environment. The processing method results in the conversion of the precursor material to a desired superconducting material, and in the healing of micro-cracks formed in the precursor during the winding process, thus optimizing the electrical properties of the coil. The superconducting coils, like most coils, are formed by winding an electrically insulated conducting material around a mandrel defining the shape of the coil. When the temperature of the coil is sufficiently low that the conductor can exist in a superconducting state, the current performance of the conductor is increased and large magnetic fields can be generated by the coil.

As is well known, certain ceramic materials exhibit superconducting behavior at low temperatures, such as the compound $Bi_2Sr_2Ca_nCu_{n+1}O_{2n+4}$ where "n" can be either 0, 1, and 2. One material, $Bi_2Sr_2Ca_2CU_3O_{10}$ (BSCCO(2223)), has performed particularly well in device applications because superconductivity and corresponding high current densities are achieved at relatively high temperatures, $T_c \cong 115°$ K. Other oxide superconductors include general Cu—O-based ceramic superconductors, such as members of the rare-earth-copper-oxide family (i.e., YBCO), thallium-bariumcalcium-copper-oxide family (i.e., TBCCO), the mercury-barium-calcium-copper-oxide family (i.e., HgBCCO), and BSCCO compounds containing lead (i.e., Bi, $Pb)_2$ $Sr_2Ca_2CU_3O_{10}$).

Electrically insulating materials surrounding the conductors are used to prevent electrical short circuits within the winding of a coil. From a design point of view, the electrical insulation layer must be able to withstand large electric fields (as high as $4 \times 10^5$ V/cm in some cases) without suffering dielectric breakdown, a phenomenon that leads to electrical cross-talk between neighboring conductors. At the same time, in the past, it was desired to make electrical insulation layers as thin as possible (typically 50–150 $\mu$m) so that the amount of superconducting material in the coil can be maximized.

By using existing conducting and electrically insulating materials, the maximum magnetic field generated by a superconducting coil is ultimately determined by the winding density (defined as the percentage of the volume of the coil occupied by the conductor) and the coil geometry. The bend strain of a conductor, equal to half the thickness of the conductor divided by the radius of the bend, is often used to quantify the amount of strain imposed on the conductor through coil formation.

Thus, instead of the "wind and react" process previously discussed, one prior method used to fabricate coils with multi- and mono-filament composite conductors is the "react and wind" process. This method first involves the formation of a insulated composite conductor which is then wound into a coil. A precursor to a composite conductor is fabricated and placed in a linear geometry, or wrapped loosely around a coil and placed in a furnace for processing. The precursor can therefore be surrounded by an oxidizing environment during processing, which is necessary for a conversion to the desired superconducting state. In the "react and wind" processing method, insulation can be applied after the composite conductor is processed, and materials issues such as oxygen permeability and thermal decomposition of the insulating layer do not need to be addressed.

In the "react and wind" process, the coil formation step can, however, result in straining composite conductors in excess of the critical strain value of the conducting filaments. Strain introduced to the conducting portion of the wire during the coil fabrication process, both bend strain and handling, can result in micro-crack formation in the ceramic grains, severely degrading the electrical properties of the composite conductor.

Alternatively, in the "wind and react" process previously discussed, the eventual conducting material is typically considered to be a "precursor" until after the final heat treating and oxidation step. Unlike the "react and wind" process, the "wind and react" method as applied to high temperature superconductors requires that the precursor be insulated before coil formation, and entails winding the coil immediately prior to a final heat treating and oxidation step in the fabrication process. This final step results in the repair of micro-cracks incurred during winding, and is used to optimize the superconducting properties of the conductor. However, these results are significantly more difficult to achieve for a coil geometry than for the individual wires which are heat treated and oxidized in the "react and wind" process.

Due to the mechanical properties of the conducting material, superconducting coils fabricated using the "wind and react" approach with composite conductors have limitations related to winding density and current carrying capability. Although the "wind and react" process may repair strain-induced damage to the superconducting material incurred during winding, the coils produced are not mechanically robust, and thermal strain resulting from cool down cycles can degrade the coil performance over time. Moreover, currently available insulation takes up a lot of winding space limiting the number of turns achievable, and further limiting the teslas at the highest field achievable in the bore of a magnet.

In accordance with the invention, the problems of the prior art "wind and react" approach are avoided by use and application of insulation which is significantly thinner. As such, the winding space saved can be used to result in more amp turns, allowing for an increase in teslas at the highest field achievable in the bore of a magnet.

SUMMARY OF THE INVENTION

In accordance with one aspect of the invention, there is provided a self-insulating substrate tape which includes a first and a second conducting tape, both having facing sides which face each other. An insulating layer secures the facing side of the first conducting tape to the facing side of the second conducting tape by adhering to the facing sides of the two tapes. The insulating layer is of a material capable of withstanding temperatures sufficiently high to make superconducting materials from refractory materials, or precursors, without substantially degrading the insulation properties of the layer.

The insulating layer is also typically a refractory or ceramic material, more typically alumina or zirconia powder, deposited at a thickness of about 5 $\mu$m to about 40 $\mu$m. More preferably, the insulating layer has been deposited using a sol-gel coating technique.

The conducting tapes are typically made of silver, nickel or nickel alloy, or silver alloy, and the silver alloy is typically one of silver magnesium alloy, silver zirconium alloy, silver aluminum alloy, or silver yttrium alloy. Further, the tapes typically have a thickness of no more than about 25 $\mu$m. The tapes are preferably bonded together by rolling, or alternatively, by conventional hot rolling, which could improve bonding of the tapes and the insulating layer together.

In an alternative aspect, the invention relates to a superconducting composite tape which includes a self insulating substrate of the type described. In addition, a first layer of high temperature superconducting material or superconductor precursor to an eventually formed superconducting material is deposited on the non-facing side of the first conducting tape, as well as on the non-facing side of the second conducting tape.

In another aspect, the superconducting composite tape is wound in two-in-hand fashion as in FIG. 3 into a pancake coil. More preferably, conducting contact is established between the outermost and/or the innermost high temperature superconducting material layer with at least a next inwardly or outwardly adjacent high temperature superconducting material layer of the pancake coil, to result in a superconducting composite tape which is assembled into a coil magnet.

In yet still another aspect, the invention relates to a method of making a self insulating substrate tape. The face of a first conducting tape is coated with an insulating material capable of withstanding temperatures sufficiently high to make superconducting materials from refractory materials without substantially degrading the insulating properties of the layer. A face of a second conducting tape is similarly coated with the insulating material. The two tapes are then bonded to each other at the coated faces to result in a substrate for high temperature conductors. As in the case with the above-described tapes, the insulating material is a refractory material or ceramic material, more typically, alumina or zirconia powder.

The conducting tapes are made of silver, nickel alloy or silver alloy, and the silver alloy being preferably silver magnesium alloy, silver zirconium alloy, silver aluminum alloy, or silver yttrium alloy. The bonding is conducted preferably by rolling the conducting tapes together with the coated faces facing each other, and alternatively with hot rolling to improve bonding. The coating of the tapes with insulating material prior to bonding is done in manner in which the resultant insulating layers between both tapes is of a thickness of about 5 $\mu$m to about 40 $\mu$m. To achieve a thickness of about 5 $\mu$m, preferably a sol-gel process is employed in applying the insulating layer.

More preferably, the invention further includes the step of coating the side edges of the self insulating substrate with a polymer coating. Thereafter, a superconducting composite tape can be made by dip coating, electrophoretic depositing or doctor blade casting of high temperature superconductor precursors on the non-coated faces of the first conducting tape and the second conducting tape. Either before winding or after winding, the assembled components can be annealed in an oxidizing atmosphere, so that the high temperature superconductor precursor material is converted to a superconducting material. The polymer coating which is used to keep the superconducting materials on either face from contacting each other, is burned off as a result of the annealing to result in clean edges of the superconducting composite tape (i.e., not shortened by the formation of superconducting phase across the edges of the first and second tapes).

BRIEF DESCRIPTION OF THE DRAWINGS

Having briefly described the invention, the same will become better understood from the following detailed discussion, made with reference to the attached drawings, in which:

FIGS. 1A, 1B and 1C shows respectively, a longitudinal section, a transverse section and a wide face view of a superconducting composite made on a self insulating substrate tape.

DETAILED DISCUSSION OF THE INVENTION

Figure 2:
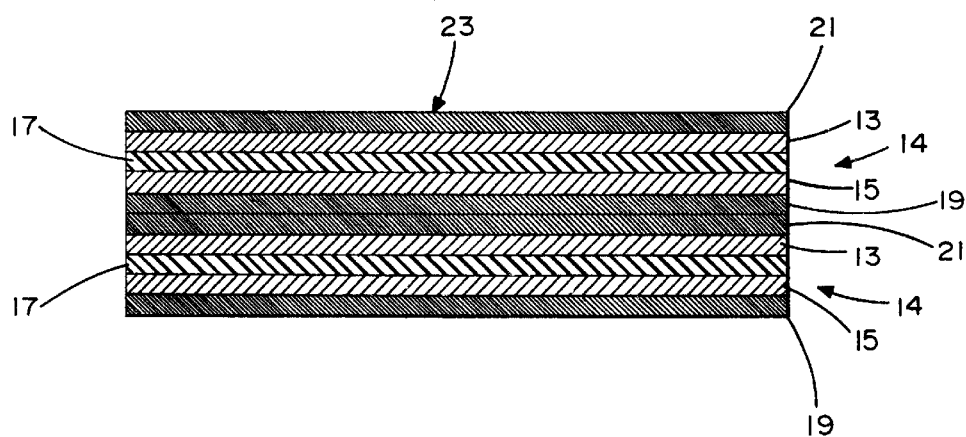
FIG. 2 is a longitudinal section view of the two superconducting composite tapes placed together in a two-in-hand fashion.

In accordance with one aspect of the invention, as shown in FIG. 1, a superconducting composite tape 11 includes a self insulating substrate tape 14 made up of an upper conductive tape layer 13 and a lower conductive tape layer 15, having interposed there between and bonded to the facing sides thereof, an insulating material 17. The superconducting composite tape 11 also includes a lower superconducting layer or superconducting precursor layer 19, and an upper superconducting layer or superconducting precursor layer 21. By the term "superconducting precursor" is meant a refractory composition, of the type known to one of ordinary skill in the art, which is later annealed at high temperature, on the order of about 700° C.–about 900° C., in an oxidizing atmosphere to result in a high critical temperature, i.e., $T_c$, superconducting material. By high temperature superconducting material, it is typically meant those superconducting materials which have a $T_c$ of greater than about 30° K.

With respect to the superconducting precursors, these are typically refractory, and more particularly, ceramic materials, which are oxidized at high temperature to result in materials which exhibit superconducting behavior at low temperatures which are considered relatively high critical temperatures for superconducting materials, on the order where $T_c=30°$ K. or higher. Such compounds have been previously mentioned and include, but are not limited to, $Bi_2Sr_2Ca_nCu_{n+1}O_{2n+4}$, particularly $Bi_2Sr_2Ca_2Cu_3O_{10}$ (BSCCO (2223, $T_c=115°$ K.), BSCCO (2212, $T_c=80°$ K.), YBCO (1,2,3, $T_c=90°$ K.)). Other oxide superconductors include general Cu—O-based ceramic superconductors such as members of the rare earth copper-oxide family and the thallium-barium-calcium-copper-oxide family (i.e., YBCO (1,2,3) and TBCCO). Others include the mercury-barium-calcium-copper-oxide family (i.e., HgBCCO), and BSCCO compounds containing lead (i.e, $(Bi,Pb)_2Sr_2Ca_2Cu_3O_{10}$).

While the specific superconducting materials, and precursors which are used to make the superconducting materials, are well known to those of ordinary skill in the art, the above examples are given for illustrative purposes only and are not intended to limit the particular selection of superconducting materials and/or recursors employed with the invention. In a specific example made with reference to FIG. 1A, the layer 21 is $YBa_2Cu_3O_x$ (YBCO), the layer 13 is silver, the layer 17 is electrically insulating material, the layer 15 is silver and the layer 19 is YBCO. In FIGS. 1B and 1C it can be seen that the top and bottom layers of YBCO were made a little shy of the edges of the layers 13, 15 and 17.

With respect to the insulating material 17, this is also typically a refractory material, i.e., ceramic, such as fine alumina, zirconia or MgO powder which are deposited on as individual layers on the facing sides of conducting tapes 13 and 15.

After depositing the insulating material on the facing sides of the tapes 13 and 15, the two tapes then can be rolled together in a conventional manner, and alternatively with conventional "hot rolling" to bond the conducting tapes and insulation layer, improving the bonding. More preferably, prior to applying the superconducting composition or precursor to the tape 14, it is possible to coat the side edges of the tape 14 with a narrow strip of an appropriate polymer in a conventional manner (not illustrated). Selection of the polymer is well known to those of ordinary skill in the art and can include enamel epoxy resin, GE varnish which can be applied by rolling brushes to the edges of the tape. By coating the edges of the self insulating substrate tape 14 in this manner, this serves to prevent superconducting layers at both sides of the tape 14 from making contact with each other when applied to the self insulating substrate tape 14, and assembled into a high temperature superconducting magnet.

Once assembled, the self insulating substrate tape 14 (SIST) can have the superconducting composition precursor applied thereto by a number of conventional techniques. Included among these techniques are using the substrate tape 14 for dip coating, electrophoretic deposition or doctor blade casting (provides an option of putting HTS on one face of the SIST) of the high temperature superconductors or superconductor precursors thereon. Preferably, prior to applying the superconducting material precursor or superconducting material to the substrate tape 14, the polymer coating on the edges of the self insulating substrate tape 14 is made very narrow, typically on the order of no more than about 0.2 mm–about 1 mm. This is applied by rolling brushes. In this manner, volume losses are reduced. The superconducting composite tape 11 is then annealed to transform the superconducting precursor material into a superconducting material, either before or after winding, and the polymer coating burns off leaving the edges clean, avoiding contact between layers of superconducting material.

FIG. 2 illustrates a longitudinal cross section of a portion 23 of a turn of a pancake coil when two of the SIST tapes 11 are wound together (two-in-hand fashion) into a pancake coil. Respective superconducting layers (layers 19 and 21) of each tape 11 stay in contact with each other throughout the pancake coil, forming the turns of the magnet. As seen from FIG. 2, the facing YBCO layers 19 and 21, as discussed previously with reference to a specific example, form the superconductivity turn in the magnet windings without requiring an additional insulation all around the SIST tape. The insulation layers fabricated within the SIST tape automatically provide the turn to turn insulation when two-in-hand (or more-in-hand for that matter) winding is adopted.

Figure 3:
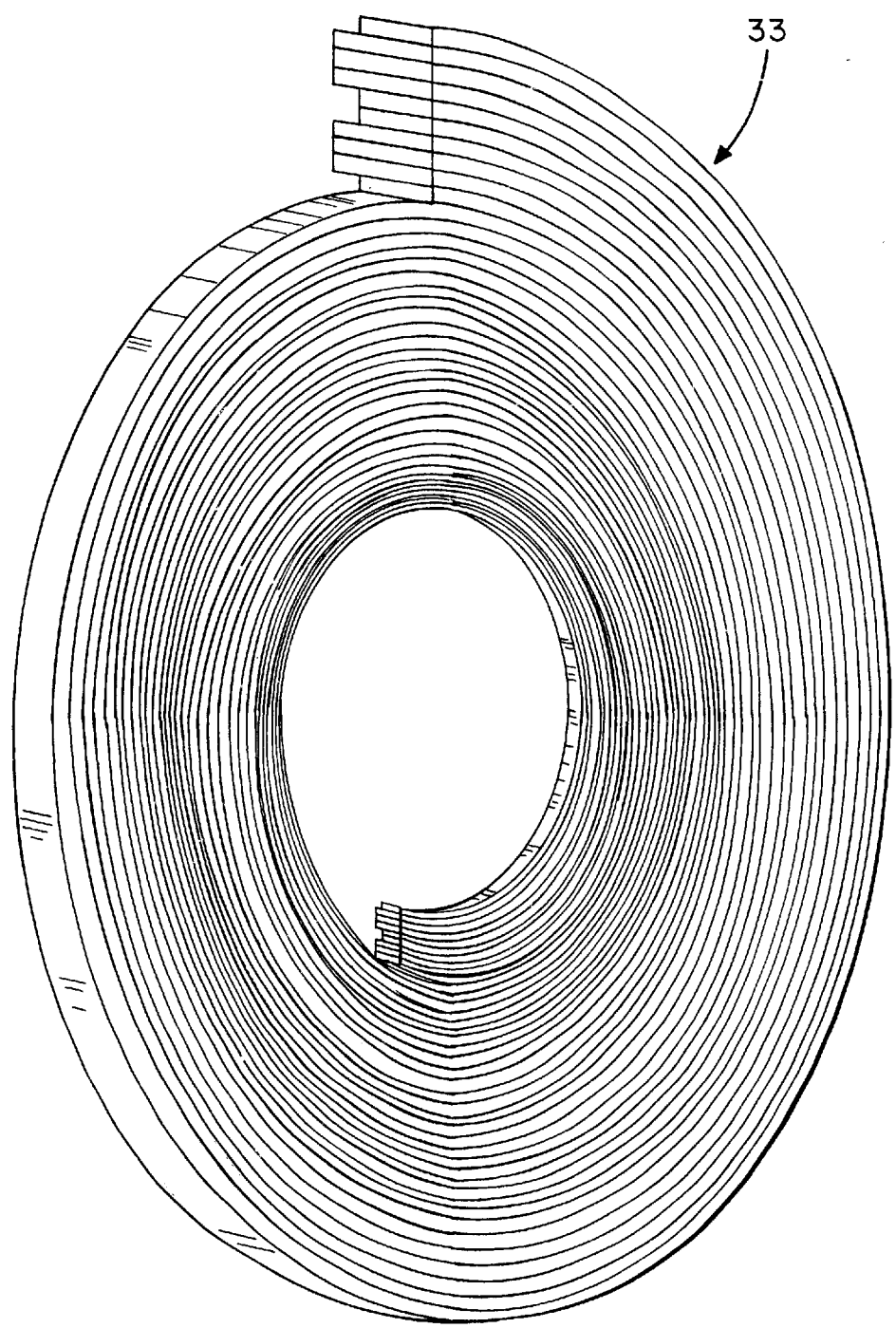
FIG. 3 is a perspective view of a superconducting composite tape wound two-in-hand fashion into a pancake coil.

FIG. 3 illustrates a pancake coil 33 wound in the two-in-hand fashion using two of the tapes 11. Note that one superconducting layer of each tape (layers 19 and 21, as in FIG. 2) forms continuous turns which are electrically insulated from each other throughout the pancake coil. Since the insulation material is high temperature compatible, there can be precursors to the HTS materials which can be transformed to HTS materials by a heat treatment as mentioned earlier.

Figure 4:
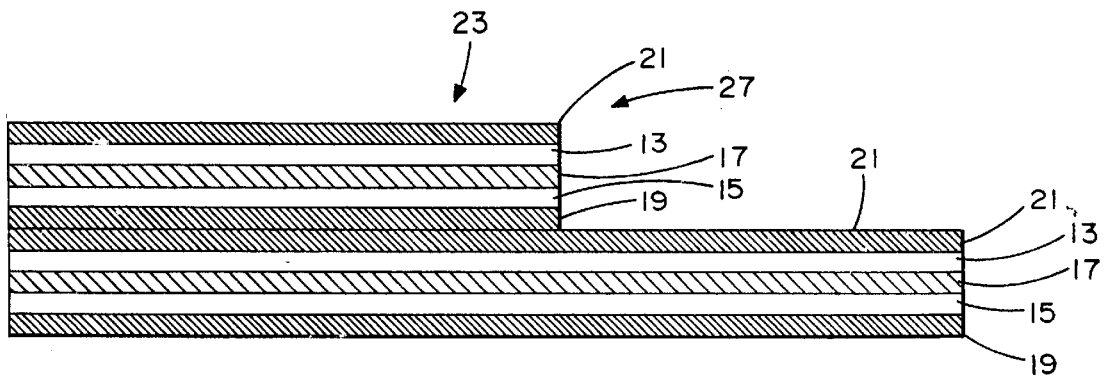
FIG. 4 is a side cross section view of the end of the superconducting composite tape after assembly into a wound magnet.
Figure 5:
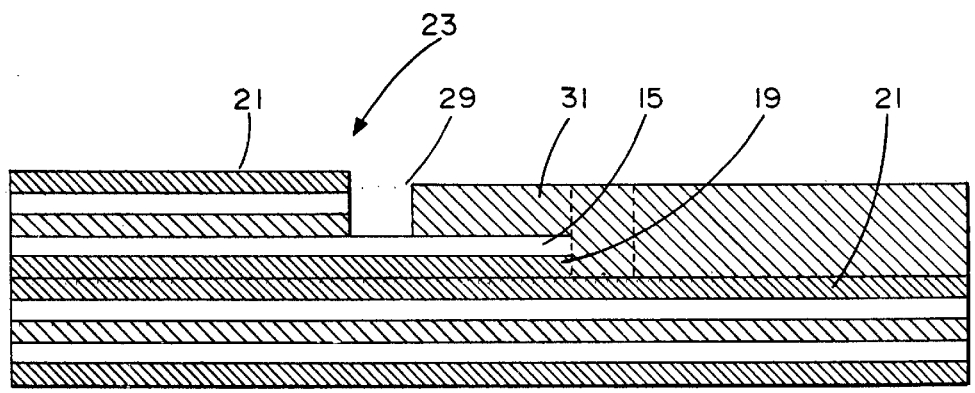
FIG. 5 is a side cross section view as in FIG. 4, showing part of the tip of the last superconducting composite tape turn of the wound magnet removed, with a current connection made between its outermost superconducting layer and an inner layer. Similarly, a like connection is established between the innermost superconducting layer and an outer layer.

FIG. 4 illustrates an end 27 of a portion 23 of the superconducting composite tape 11 after being wound into a pancake for use as a magnet. As may be appreciated, from a review of FIG. 4, the innermost (not illustrated) and outermost current turns 25 have only one superconducting layer so that these layers do not carry current. Accordingly, connections are made as seen in FIG. 5, in which part of the tip of the last tape, or the innermost tape as may be appropriate, is cut away to result in a cut away section 29. A current connection 31 is made to complete the current turn of the complete assembly of the magnet. FIG. 5 shows connection 31 for the outermost turn. A similar current connection is established for the innermost turn (not shown).

By manufacturing the self insulating substrate tape 11 in accordance with the invention, this eliminates the problem of providing necessary insulation for the construction of high temperature superconducting magnets, and allows application of the "wind and react" process with insulation away from the high temperature superconducting phase, i.e., prior to annealing of superconducting precursor materials. Thus, in a more general aspect, the self insulating substrate tape can be manufactured by coating only one side of each of two conducting tapes with alumina or zirconia based high temperature ceramics. The two tapes are then pressed together, making good contact and let dry. In this manner, very thin insulating layers, much thinner than those available in the prior art are achievable. By using the process in accordance with the invention and applying alumina or zirconia based high temperature ceramic materials, insulating layer thicknesses of less than about 40 μm are achievable. More preferably, by using the sol-gel process which is well known to those of ordinary skill in the art and conventional, it becomes possible to achieve insulating layer thicknesses as low as about 5 μm, as compared to the prior art techniques which result in insulation layers of 50–150 μm.

Typically, spray coating or roll coating processing achieves deposition of alumina, zirconium or MgO with a mixture having a solvent, a binder and a dispersant in a ratio which is easily selected by those of ordinary skill in the art. One specific application involves deposition of alumina with butanol as the solvent, poly-vinyl-butyryl as the binder, and a dispersant of sorbitan trioleate, in a weight ratio of 11:34:3:2. Zirconia has also been deposited with the same solvent, binder and dispursant, and in the same weight ratio.

Alternatively, there also exist commercially available high temperature bonding agents which are zirconia and alumina based, and which can be used with conventional thinners to apply the insulating layer using the spray or roll coating approach.

More recently, the sol-gel approach was used to deposit the insulating layer by applying a mixture of zirconiumtetrabutoxide, isopropanol and acetylacetone. In the sol-gel process, making the self insulating substrate tape is the same as previously described. What is different is the insulation coating on the facing sides of the conducting tapes. The sol-gel insulation coating of the facing sides of the preferably 25 μm, silver tapes is done by roll coating the sol, or solution, which is a mixture of zirconiumtetrabutoxide, isopropanol and acetylacetone. Thus, this is done in one preferred ratio, of zirconiumtetrabutoxide and isopropanol 1:5 weight ratio and of zirconiumtetrabutoxide and acetylacetone 1:1 molar ratio. A first sol-gel coating is applied and cured at about 600° C. for about ten minutes. A second sol-gel coating is applied. After the second sol-gel coating is applied, the two conducting tapes are rolled and cured at about 500° C. for about ten minutes.

All of the insulating materials are typically refractory materials, i.e., ceramic, which can be heated to superconducting precursor annealing temperatures, i.e., about 700° C.–about 900° C. without undergoing substantial physical degradation, or substantial degradation of their insulative properties.

With respect to the materials selected for the conducting tapes, these tapes are in one embodiment typically made of silver. Alternatively, nickel alloys. Silver alloys such as silver magnesium alloy, silver zirconium alloy, silver aluminum alloy and silver yttrium alloy, which are conventional and well known to those of ordinary skill in the art, can also be employed.

In the case of the silver alloys, the second component, i.e., magnesium, zirconium, aluminum or yttrium, make up about 0.1 atomic percent of the alloy. With respect to silver tapes, there are currently commercially available tapes having a thickness of about 25 μm which, depending on the method of applying the insulating material selected, can, through the practice of invention, result in a self insulating substrate tape having a thickness of about 55 μm to about 90 μm, which would result in significantly thinner turns in a high temperature superconducting magnet than anything presently available by currently existing prior art techniques.

The foregoing descriptions of preferred embodiments of the processing methods, materials and related inventions have been presented for purposes of illustration and description. They are not intended to be exhaustive or to limit the invention to the precise form disclosed. The embodiments chosen are described in order to best explain the principles of the processing method and invention, and the articles assembled thereby.

What is claimed is:

1. A self insulating substrate tape, comprising:

a first conducting tape having a facing side;

a second conducting tape having a facing side facing the facing side of said first conducting tape;

an electrically insulating layer interposed between the first conducting tape and the second conducting tape, and securing said first conducting tape to said second conducting tape by adhering to the facing sides of said first conducting tape and said second conducting tape, said electrically insulating layer being capable of withstanding temperatures sufficiently high to make superconducting materials from refractory materials to be applied on the non-facing sides of the first and second conducting tapes without substantially degrading the electrically insulating properties of said layer; and a layer of one of a superconducting material and a superconducting material precursor on each of said first conducting and second conducting tapes on the sides thereof opposite said facing sides.

2. A self insulating substrate tape as in claim 1, wherein said first and second conducting tapes are made of one of silver, nickel, nickel alloy and silver alloy.

3. A self insulating substrate tape as in claim 2, wherein said first and said second conducting tapes are made of a silver alloy selected to be one of silver magnesium alloy, silver zirconium alloy, silver aluminum alloy and silver yttrium alloy.

4. A self insulating substrate tape as in claim 2, wherein said first and said second conducting tapes are made of one of a nickel alloy and a nickel chromium alloy which is a haste alloy.

5. A self insulating substrate tape as in claim 1, wherein said insulating layer is made of one of alumina, zirconia and MgO.

6. A self insulating substrate tape as in claim 1, wherein said insulating layer is made of refractory material.

7. A self insulating substrate tape as in claim 1, wherein said insulating layer is of a thickness of about 5 microns to about 40 microns.

8. A self insulating substrate tape as in claim 7, in which said insulating layer has been deposited on said first and said second conducting tape by a sol-gel coating technique.

9. A self insulating substrate tape as in claim 6, in which said first and said second conducting tapes are bonded together by rolling.

10. A self insulating substrate tape as in claim 9, in which said first and said second conducting tapes are bonded together by hot rolling.

11. A self insulating substrate tape as in claim 1, wherein each one of said first and said second conducting tapes has a thickness of about 25 microns.

12. A self insulating substrate tape as in claim 1 further comprising a polymer coating on the edges of said substrate to prevent superconducting materials or superconducting material precursors which have been deposited on the non-facing sides of the first and the second conducting tapes, from making contact with each other, after having been deposited thereon.

* * * * *

UNITED STATES PATENT AND TRADEMARK OFFICE
CERTIFICATE OF CORRECTION

PATENT NO. : 6,387,525 B1
DATED : May 14, 2002
INVENTOR(S) : Ibrahim Belenli, Yusuf Hascicek and Ibrahim Mutlu It is certified that error appears in the above-identified patent and that said Letters Patent is hereby corrected as shown below:

Column 1,
Line 60, after "$Cu_{n+}$" add a subscript digit -- $_1$ --
Line 65, after "$T_c$" delete the symbol "≡" and insert the symbol -- ≅ --

Column 2,
Line 1, after "barium" and before "calcium" insert a hyphen -- - --

Signed and Sealed this

Twenty-fourth Day of December, 2002

JAMES E. ROGAN
*Director of the United States Patent and Trademark Office*